(12) United States Patent
Craig

(10) Patent No.: US 12,713,570 B2
(45) Date of Patent: Aug. 18, 2026

(54) POWER CONNECTOR HAVING AN EMI ENCLOSURE

(71) Applicant: TE Connectivity Solutions GmbH, Schaffhausen (CH)

(72) Inventor: Evan Lawrence Craig, Vernon Hills, IL (US)

(73) Assignee: TE Connectivity Solutions GmbH (CH)

( * ) Notice: Subject to any disclaimer, the term of this patent is extended or adjusted under 35 U.S.C. 154(b) by 356 days.

(21) Appl. No.: 17/876,325

(22) Filed: Jul. 28, 2022

(65) Prior Publication Data

US 2024/0040756 A1 Feb. 1, 2024

(51) Int. Cl.

*H05K 9/00* (2006.01)
*H01H 85/20* (2006.01)
*H01H 85/22* (2006.01)
*H01H 85/54* (2006.01)
*H01R 13/688* (2011.01)

(52) U.S. Cl.

CPC ....... *H05K 9/0018* (2013.01); *H01H 85/2015* (2013.01); *H01H 85/2045* (2013.01); *H01H 85/22* (2013.01); *H01H 85/547* (2013.01); *H01R 13/688* (2013.01)

(58) Field of Classification Search

CPC ............... H05K 9/0018; H05K 7/2039; H01H 85/2015; H01H 85/2045; H01H 85/22; H01H 85/547; H01R 13/688; H01R 13/6582; H01R 13/6581; H01R 13/68

See application file for complete search history.

(56) References Cited

U.S. PATENT DOCUMENTS

| | | | | |
|---|---|---|---|---|
| 5,566,052 A * | 10/1996 | Hughes | H05K 9/0032 | 257/713 |
| 6,388,189 B1 * | 5/2002 | Onoue | H05K 7/20436 | 361/752 |
| 6,949,706 B2 * | 9/2005 | West | H05K 9/0032 | 174/384 |
| 7,170,014 B1 * | 1/2007 | Liang | H01L 23/552 | 257/E23.102 |
| 9,547,141 B2 | 1/2017 | Wu et al. | | |
| 10,283,309 B2 | 5/2019 | Craig | | |

(Continued)

OTHER PUBLICATIONS

Extended European Search Report European App. No. 23187496. 7-1201 International Filing Date Dec. 19, 2023.

*Primary Examiner* — Jacob R Crum

(57) ABSTRACT

A power connector includes a housing having a front wall including a socket configured to receive a power plug. The power connector includes an electrical component held by the housing being electrically connected to a power contact in the socket. The electrical component is a heat generating component. The power connector includes an EMI enclosure coupled to the housing. The EMI enclosure has walls defining a chamber. The housing, power contacts, and electrical component are received in the chamber. The walls of the EMI enclosure provide EMI shielding for the electrical component. The EMI enclosure includes a flap extending from a wall of the EMI enclosure into the chamber having a flap thermal interface thermally coupled to the electrical component to dissipate heat from the electrical component.

23 Claims, 6 Drawing Sheets

(56) References Cited

U.S. PATENT DOCUMENTS

| | | | | |
|---|---|---|---|---|
| 2007/0070606 | A1* | 3/2007 | Guo | H05K 9/005<br>361/714 |
| 2009/0002949 | A1* | 1/2009 | Pawlenko | H05K 9/0026<br>361/818 |
| 2011/0306253 | A1 | 12/2011 | Kumamoto et al. | |
| 2013/0201651 | A1* | 8/2013 | Schnekenburger | H01Q 17/00<br>361/818 |
| 2014/0238647 | A1 | 8/2014 | Pikovsky | |
| 2018/0350547 | A1* | 12/2018 | Craig | H01H 9/10 |
| 2021/0280383 | A1* | 9/2021 | Kwon | H01H 85/0013 |
| 2022/0216632 | A1 | 7/2022 | Sharf | |

* cited by examiner

POWER CONNECTOR HAVING AN EMI ENCLOSURE

BACKGROUND OF THE INVENTION

The subject matter herein relates generally to power connectors.

Power connectors are used in equipment to power the equipment. For example, the power connector may be a power entry module having power terminals in a power socket that receives power supply from a power plug. For some equipment, it may be desirable to place components of the power connector inside an electrically conductive enclosure to protect the components, or external electrical components, from electro-magnetic interference (EMI). For some equipment, it may be desirable to provide a common-mode coil in an EMI filter of the power connector. For some equipment, it may be desirable to provide a switch in the power connector, such as to turn the power circuit on or off at the power connector. For some equipment, it may be desirable to provide fusing in the power connector. Fuses are electrical safety components consisting of a wire or strip that melts and interrupts a circuit when the current passing through the fuse exceeds a particular amperage. Once a fuse is blown, i.e., the wire or strip melts, the fuse must be replaced to re-establish the circuit. The components within the power connector generate heat. For example, the terminals, the fuses, the switch, the common-mode coil, or other components may generate heat within the power connector.

Thermal management of the components is difficult, particularly when the components are arranged in a small package, such as to fit within the enclosure. The enclosure includes contiguous surfaces made of thermally conductive material. The surfaces of the enclosure transmit heat readily across the surfaces from hotter areas to cooler areas, thus heating the cooler areas and cooling the hotter areas. However, such thermal transfer may encumber the ability to intentionally maintain some components or materials inside the enclosure at a lower temperature than other components or materials inside the enclosure. Additionally, the rigid surfaces of the enclosure are unable to adapt to the position of internal components and materials. This results in air gaps with low thermal conductivity, which inhibit heat transfer between the components and the enclosure.

A need remains for a power connector providing EMI shielding and having efficient thermal management for the components of the power connector.

BRIEF DESCRIPTION OF THE INVENTION

In one embodiment, a power connector is provided and includes a housing having a front wall including a socket configured to receive a power plug. The power connector includes power contacts held by the housing. The power contacts have mating ends in the socket for mating with the power plug. The power connector includes an electrical component held by the housing. The electrical component is electrically connected to at least one of the power contacts. The electrical component is a heat generating component. The power connector includes an EMI enclosure coupled to the housing. The EMI enclosure has walls defining a chamber. The housing is received in the chamber. The power contacts are received in the chamber. The electrical component is received in the chamber. The walls of the EMI enclosure provide EMI shielding for the electrical component. The EMI enclosure includes a first flap extending from a first wall of the walls into the chamber. The first flap includes a flap thermal interface thermally coupled to the electrical component to dissipate heat from the electrical component.

In another embodiment, a power connector for a device is provided. The power connector is provided and includes a housing having a front wall that includes a socket configured to receive a power plug. The power connector is provided and includes a power contact held by the housing. The power contact has a mating end in the socket for mating with the power plug. The power connector is provided and includes a power terminal held by the housing. The power terminal has a terminating end configured to be electrically connected to a device power circuit of the device to supply power to the device. The power connector is provided and includes a fuse holder coupled to the housing. The fuse holder includes a fuse pocket holding a fuse. The fuse has end caps and a fuse wire between the end caps. The power connector is provided and includes an input fuse contact coupled to the power contact. The input fuse contact includes an input contact arm coupled to the corresponding end cap of the fuse. The power connector is provided and includes an output fuse contact coupled to the power terminal. The output fuse contact includes an output contact arm coupled to the corresponding end cap of the fuse. The power connector is provided and includes an EMI enclosure coupled to the housing. The EMI enclosure has walls defining a chamber. The chamber receiving the fuse, the input fuse contact, and the output fuse contact. The walls of the EMI enclosure providing EMI shielding for the fuse. The EMI enclosure includes a first flap extending from a first wall of the walls into the chamber. The first flap includes a flap thermal interface thermally coupled to at least one of the input fuse contact and the output fuse contact.

In a further embodiment, an EMI enclosure for a power connector is provided and includes walls defining a chamber. The walls include a first end wall, a second end wall, a first side wall extending between the first and second end walls, and a second side wall extending between the first and second end walls. The walls include a back wall at a rear of the chamber. The EMI enclosure includes a first flap being stamped from the first side wall and extending from the first side wall into the chamber. The first flap includes a fixed end and a free end. The first flap includes a flap thermal interface at an interior surface of the first flap. The flap thermal interface is configured to be thermally coupled to an electrical component of the power connector located in the chamber to dissipate heat from the electrical component.

DETAILED DESCRIPTION OF THE INVENTION

Figure 1:
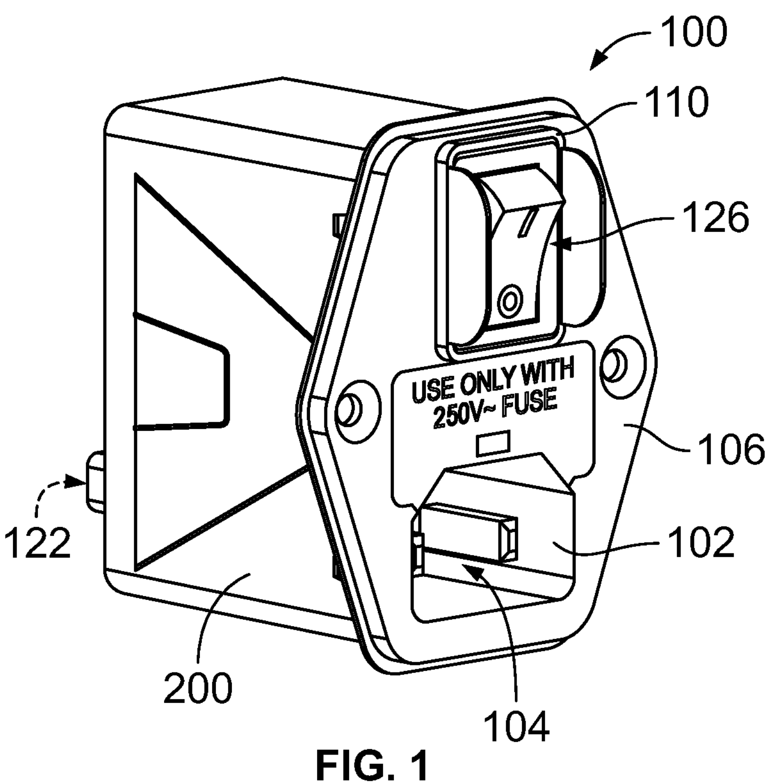
FIG. 1 is a perspective view of a power connector in accordance with an exemplary embodiment.

FIG. 1 is a perspective view of a power connector 100 in accordance with an exemplary embodiment. The power connector 100 is used in the equipment to power the equipment. In an exemplary embodiment, the power connector 100 is a power entry module used to supply power to the equipment. The power connector 100 may be used in an appliance, medical equipment, a computer system, or other type of equipment. In an exemplary embodiment, the power connector 100 includes a power socket 102 configured to receive a power supply plug.

The power connector 100 includes a housing 110 holding various electrical components 104. The power connector 100 includes an EMI enclosure 200 that provides electrical shielding for the electrical components 104. The housing 110 is received in the EMI enclosure 200. In an exemplary embodiment, the EMI enclosure 200 is used for thermal management of the electrical components 104. For example, the EMI enclosure 200 is used to dissipate heat from the electrical components 104. In an exemplary embodiment, the power connector 100 includes a faceplate 106 coupled to the front of the housing 110. The faceplate 106 may be used for mounting the power connector 100 to the equipment, such as to a chassis, box, or panel of the equipment.

Figure 2:
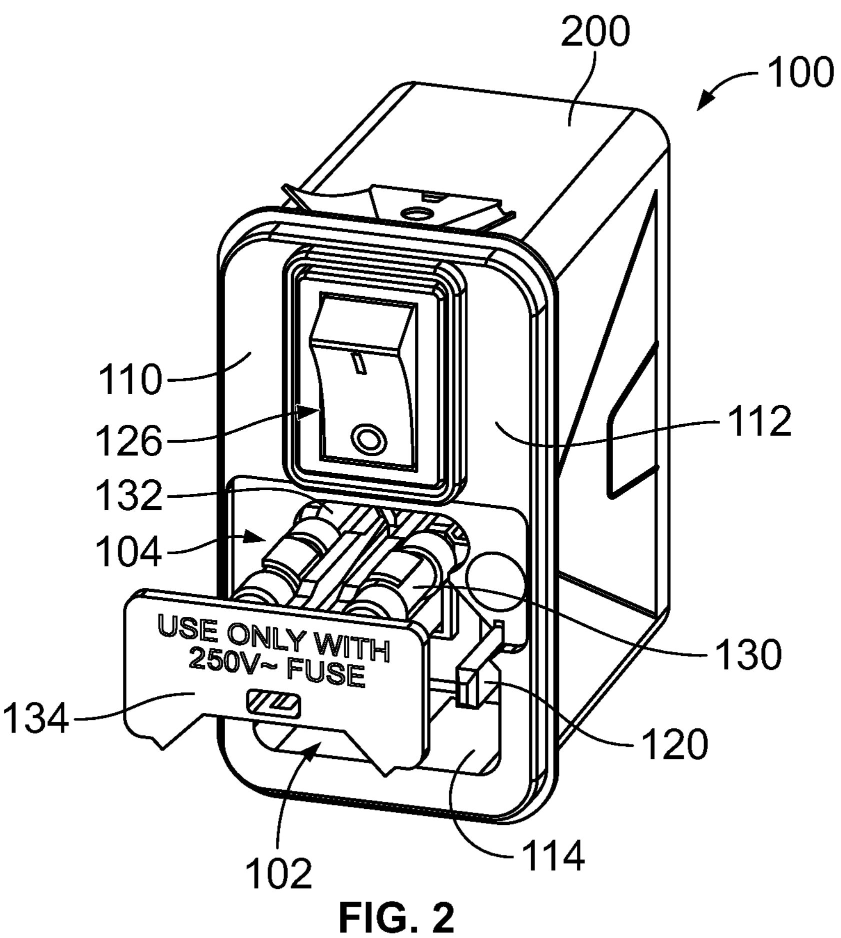
FIG. 2 is a front perspective view of a portion of the power connector with snap-in faceplate and snap-in clips (FIG. 1) to illustrate the housing and other components of the power connector in accordance with an exemplary embodiment.

With additional reference to FIG. 2, FIG. 2 is a front perspective view of a portion of the power connector 100 with a snap-in faceplate 106 (FIG. 1) and snap-in clips to illustrate the housing 110 and other components of the power connector 100. The housing 110 includes a front wall 112 and a main body 114 extending rearward from the front wall 112. The main body 114 is received in the EMI enclosure 200. The housing 110 includes an opening or receptacle that defines the socket 102.

In an exemplary embodiment, the electrical components 104 include power contacts 120, power terminals 122 (shown in FIG. 4), and EMI coil or filter 124 (shown in FIG. 4), a switch 126, fuses 130, fuse contacts 132 (shown in FIG. 4), or other components, such as a circuit breaker, a solid state component, or other heat generating component. Other types of electrical components 104 may be provided in alternative embodiments. The power contacts 120 are configured to be coupled to the power plug and define a power input for the power connector 100. The power terminals 122 are configured to be electrically connected to the equipment to supply power to the equipment. For example, the power terminals 122 may be connected to wires or another electrical connector of the equipment. The EMI filter 124 is a passive circuit that attenuates RF emissions. The EMI filter 124 may be connected to the power contacts 120 and/or the power terminals 122. The switch 126 is used to turn the power connector 100 on and off to control power flow through the power connector 100. The fuses 130 provide a fuse connection between the power contacts 120 and the power terminals 122. The fuse contacts 132 electrically connect the fuses 130 to the power contacts 120 and to the power terminals 122. For example, the fuse contacts 132 may be coupled to both ends of the fuses 130. In an exemplary embodiment, the fuses 130 are held in a fuse holder 134 that is movable relative to the housing 110. For example, the captive fuse holder 134 may be extended into the housing 110, as shown in FIG. 2, such as to replace the fuses 130 without removing the housing 110 from the EMI enclosure 200.

Some or all of the electrical components 104 may generate heat when power is transmitted through the power connector 100. In an exemplary embodiment, the EMI enclosure 200 dissipates heat from one or more of the electrical components 104. For example, the EMI enclosure 200 may be thermally coupled to one or more of the electrical components 104. In an exemplary embodiment, the EMI enclosure 200 targets heat dissipation from one or more of the electrical component 104. For example, the EMI enclosure 200 includes features that thermally target the electrical components 104 to dissipate heat from the electrical component 104. The EMI enclosure 200 may include features that thermally isolate various electrical components 104 to prevent increasing temperatures of various electrical components 104. For example, the EMI enclosure 200 may include thermal barriers to prevent heat spreading to certain areas of the EMI enclosure 200.

Figure 3:
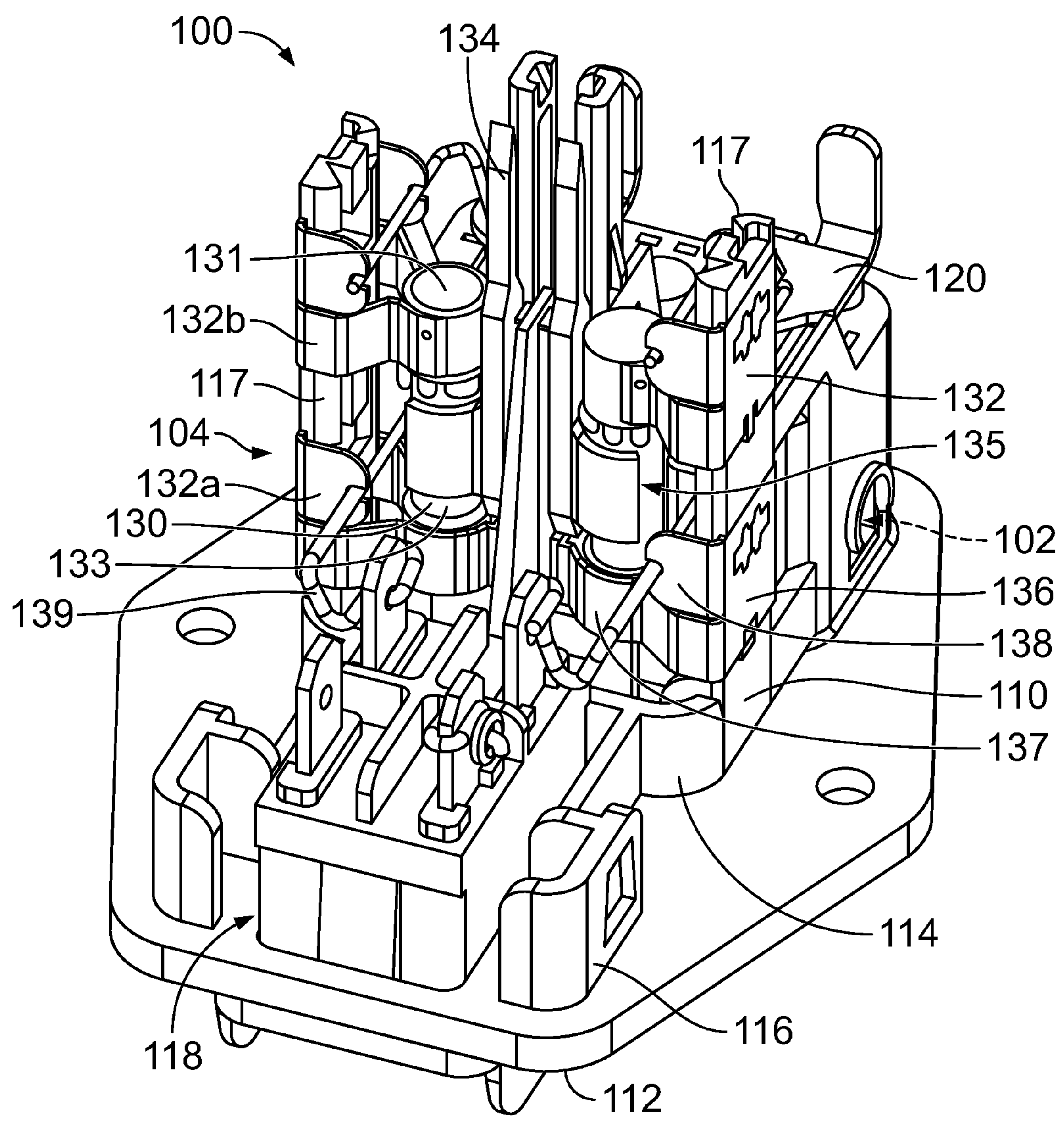
FIG. 3 is a rear perspective view of a portion of the power connector in accordance with an exemplary embodiment showing various electrical components held by the housing.
Figure 4:
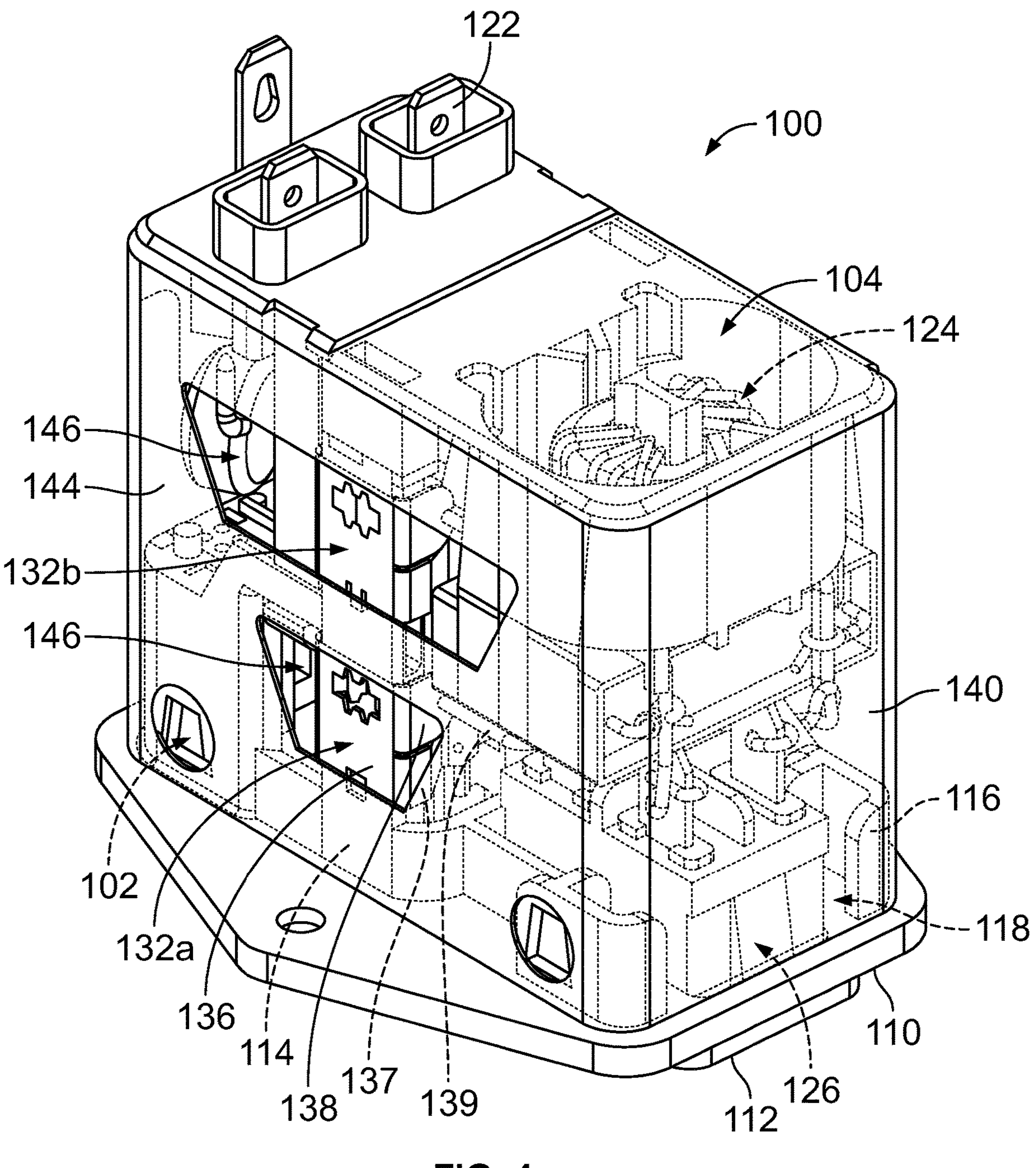
FIG. 4 is a rear perspective view of a portion of the power connector in accordance with an exemplary embodiment showing various electrical components held by the housing and an electrical insulator surrounding the electrical components.
Figure 5:
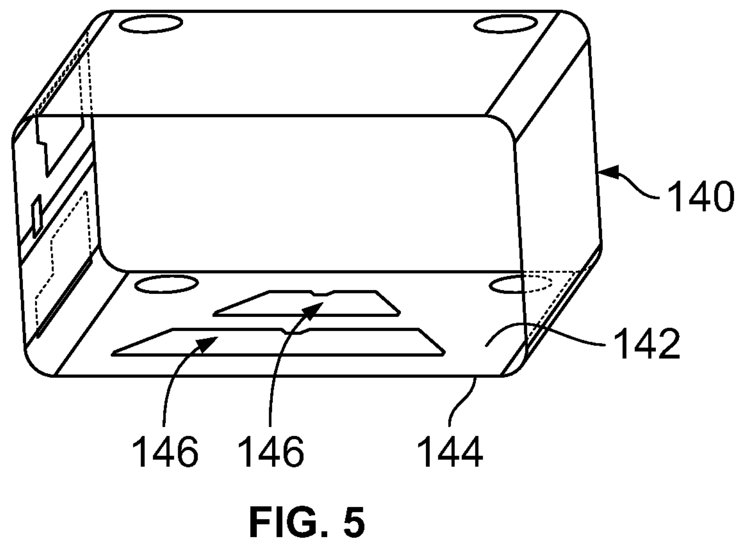
FIG. 5 is a perspective view of the electrical insulator in accordance with an exemplary embodiment.

FIG. 3 is a rear perspective view of a portion of the power connector 100 in accordance with an exemplary embodiment showing various electrical components 104 held by the housing 110. FIG. 4 is a rear perspective view of a portion of the power connector 100 in accordance with an exemplary embodiment showing various electrical components 104 held by the housing 110 and an electrical insulator 140 surrounding the electrical components 104. FIG. 5 is a perspective view of the electrical insulator 140 in accordance with an exemplary embodiment. FIGS. 3 and 4 have the EMI enclosure 200 removed to illustrate the electrical components 104 of the power connector 100.

The main body 114 of the housing 110 is located rearward of the front wall 112. The main body 114 includes a plurality of walls 116 that form cavities 118 that receive the various electrical components 104. For example, the switch 126 may be received in one of the cavities 118. Other cavities may hold the EMI filter 124 (FIG. 4) and/or the power terminals 122 (FIG. 4). The walls 116 also define the socket 102 and support the power contacts 120 (FIG. 3), which extend into the socket 102. In an exemplary embodiment, the walls 116 include posts 117 that support the fuse contacts 132. The fuse holder 134 (FIG. 3) may be received in one of the cavities 118, such as between the posts 117. Other arrangements are possible in alternative embodiments. For example, the housing 110 may include other walls 116 and/or cavities 118 or other types of supporting features to support the electrical components 104 within the housing 110.

In an exemplary embodiment, the fuse holder 134 is a slide that is slidably coupled to the housing 110 and movable between an extended position (FIG. 2) and a retracted position (FIG. 3). The fuse holder 134 includes holder clasps that define one or more fuse pockets 135 that hold the fuses 130. In an exemplary embodiment, each fuse 130 includes fuse end caps 131 and a fuse wire 133 between the end caps 131. The fuse wire 133 defines a fusible link between the end caps 131. The fuse wire 133 may melt or blow wherein excessively heated. Other types of fuses may be used in alternative embodiments.

The fuse contacts 132 are configured to be electrically connected to corresponding end caps 131 of the fuse 130. In various embodiments, one of the fuse contacts 132 may connect to the end cap 131 at an input side of the fuse 130 while the other fuse contact 132 may connect to the end cap

131 and an output side of the fuse 130. Such fuse contacts 132 may be referred to as input fuse contacts 132*a* and output fuse contacts 132*b*.

In an exemplary embodiment, each fuse contact 132 includes a base portion 136 defining a fuse clip base coupled to the housing 110, such as coupled to the corresponding post 117. Each fuse contact 132 includes one or more fuse clip contact arms 137 extending from the base portion 136. The contact arms 137 are configured to engage the end caps 131. For example, the contact arms 137 may be spring biased against the end caps 131. In various embodiments, the contact arms 137 are clipped onto the end caps 131. The contact arms 137 engage the end caps 131 at separable interfaces, which allows the fuse 130 to be easily removed from the power connector 100. In an exemplary embodiment, each fuse contact 132 includes a wire contact or fuse clip stake terminal 138 coupled to a wire 139. The wire 139 may be a jumper wire routed to another electrical component 104, such as the switch 126 and/or the power terminals 122 and/or the power contacts 120. In an exemplary embodiment, the input fuse contacts 132*a* are electrically connected to the power contacts 120 and the output fuse contacts 132*b* are electrically connected to the power terminals 122. In various embodiments, the wire contacts 138 may be insulation displacement contacts and the wires 139 may be press-fit into wire slots in the wire contacts 138. In alternative embodiments, the wire contacts 138 are soldered to the wires 139.

During operation, as power is transmitted through the power connector 100, the fuse 130 and/or the fuse contacts 132 generate heat. For example, as power is transmitted through the fuse 130 and the fuse contacts 132, the temperature of the fuse 130 and/or the fuse contacts 132 increases. In an exemplary embodiment, the EMI enclosure 200 (FIGS. 1 and 2) is configured to be thermally coupled to the fuse contacts 132 to dissipate heat from the fuse contacts 132 and the fuses 130. For example, the base portions 136 have large surface areas exposed at the outside surfaces of the posts 117 that define thermal interfaces for thermally connecting the EMI enclosure 200 to the fuse contacts 132.

During operation, as power is transmitted through the power connector 100, the power contacts 120 and the power terminals 122 generate heat. For example, the temperature of the power contacts 120 and the power terminals 122 increases as power is transmitted through the power connector 100. In an exemplary embodiment, the EMI enclosure 200 is configured to be thermally coupled to the power contacts 120 and/or the power terminals 122. For example, portions of the power contacts 120 and/or the power terminals 122 may be located proximate to the exterior of the housing 110 for thermal connection with the EMI enclosure 200.

In an exemplary embodiment, during assembly of the power connector 100, such as after all of the electrical components 104 are coupled to the housing 110, the electrical insulator 140 may be coupled to the housing 110 and/or the electrical component 104. The electrical insulator 140 is used to electrically insulate the electrical components 104 from the EMI enclosure 200. For example, the electrical insulator 140 is electrically nonconductive. The electrical insulator 140 may be wrapped around the exterior of the housing 110 to cover the electrical component 104.

In an exemplary embodiment, the electrical insulator 140 is a flexible film, such as a mylar film. The electrical insulator 140 may be a flexible circuit board in various embodiments. The electrical insulator 140 includes an inner surface 142 and an outer surface 144. In an exemplary embodiment, the electrical insulator 140 includes one or more thermal spreader pads 146 provided on the inner surface 142 and/or the outer surface 144. The thermal pads 146 are thermally conductive. In an exemplary embodiment, the thermal pads 146 have a higher thermal conductivity than the material of the electrical insulator 140. For example, the thermal pads 146 may be metal pads, such as copper or silver pads. The thermal pads 146 may be a coating or other layer applied to the flexible film. The thermal pads 146 may be printed circuits on the flexible film. The thermal pads 146 are strategically located at areas of the electrical insulator 140 that are configured to be aligned with the heat generating electrical components 104. For example, the thermal pads 146 may be provided at locations adjacent the fuse contacts 132 and/or the power contacts 120 and/or the power terminals 122. The thermal pads 146 may have large surface areas to thermally couple to, conduct and spread heat from the heat generating electrical components 104. In other embodiments, the electrical insulator 140 may be an insulating film arrayed with areas of diecut pressure sensitive metal tape applied at predetermined areas to define the thermal pads 146.

In various embodiments, the thermal pads 146 may be provided on the inner surface 142 to directly engage the heat generating electrical components 104 such that the electrically insulative flexible film is configured to be located between the thermal pads 146 and the EMI enclosure 200 to electrically isolate the EMI enclosure 200 from the thermal pads 146. In other various embodiments, the thermal pads 146 are provided on the outer surface 144 to directly engage the EMI enclosure to transfer heat between the thermal pads 146 in the EMI enclosure 200. In such embodiments, the electrically insulative flexible film is configured to be located between the thermal pads 146 and the heat generating electrical components 104. In various embodiments, thermal paste, thermal grease, or other thermal interface material may be provided on the thermal pads 146 and/or on the EMI enclosure 200 (for example, on thermal flaps) and/or on the electrical components 104 to enhance thermal transfer between the parts.

Figure 6:
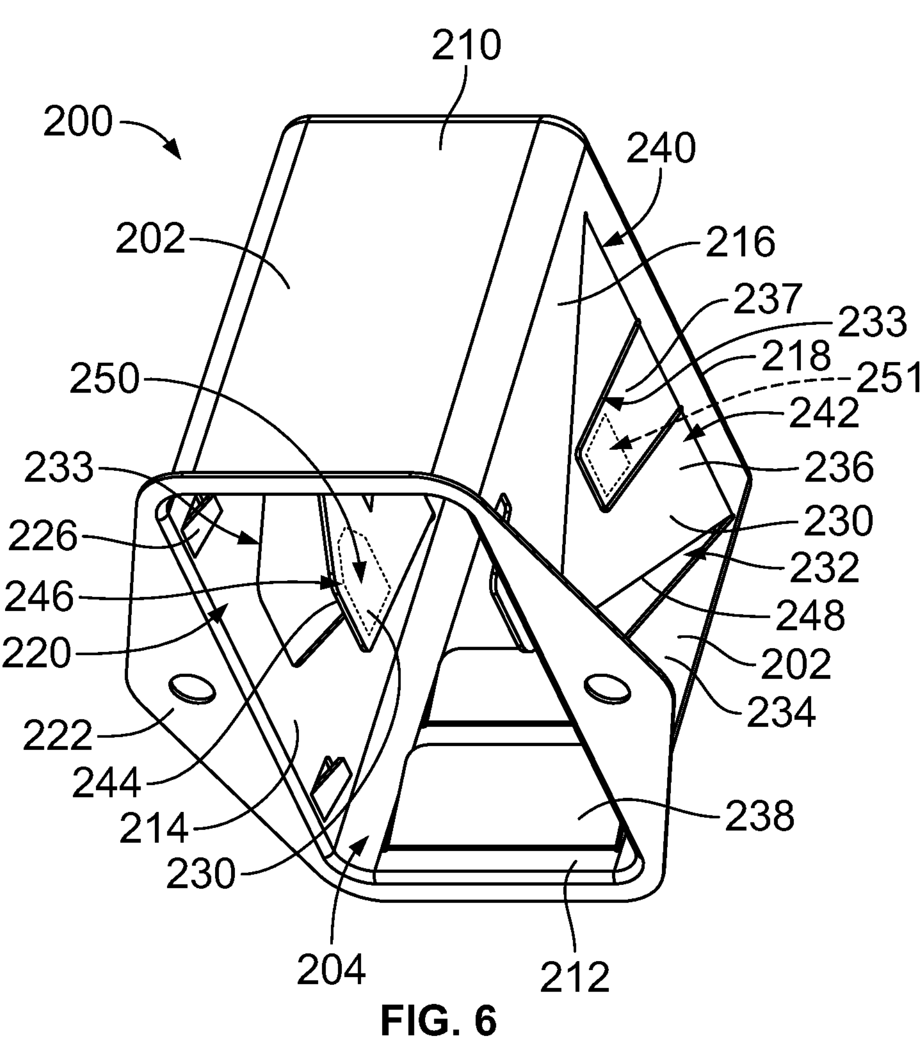
FIG. 6 is a front perspective view of the EMI enclosure in accordance with an exemplary embodiment.
Figure 7:
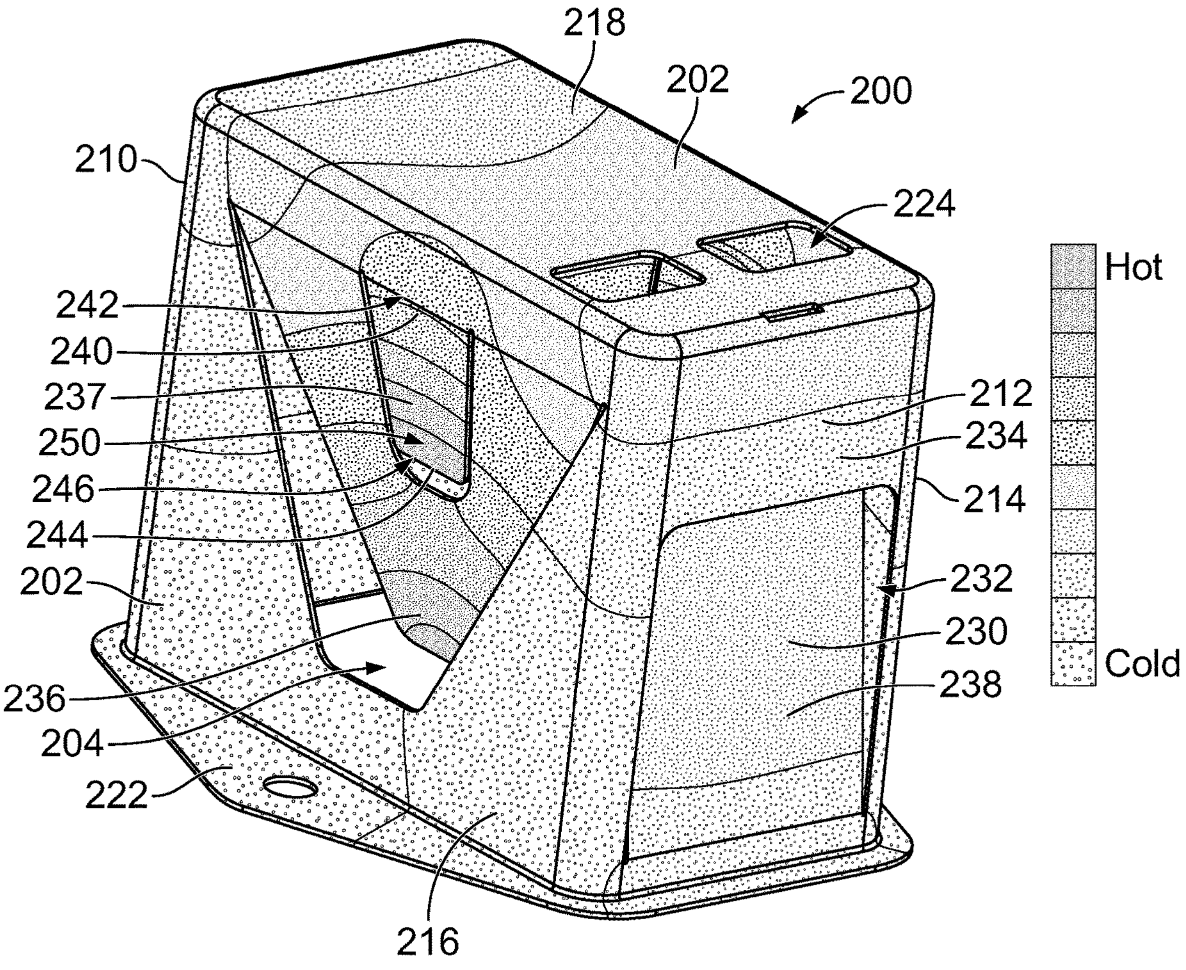
FIG. 7 is a rear perspective view of the EMI enclosure in accordance with an exemplary embodiment.

FIG. 6 is a front perspective view of the EMI enclosure 200 in accordance with an exemplary embodiment. FIG. 7 is a rear perspective view of the EMI enclosure 200 in accordance with an exemplary embodiment. FIG. 7 is a thermograph showing areas of different temperature as heat is dissipated by the EMI enclosure 200. The EMI enclosure 200 includes a plurality of enclosure walls 202 defining an enclosure chamber 204. The chamber 204 is configured to receive the housing 110 and the electrical components 104 (shown in FIGS. 3 and 4). The walls 202 of the EMI enclosure 200 provide EMI shielding for the electrical components 104. In an exemplary embodiment, the walls 202 of the EMI enclosure 200 are used to dissipate heat from the heat generating electrical components 104 within the chamber 204.

In an exemplary embodiment, the EMI enclosure 200 is manufactured from a conductive material, such as a metal material. In various embodiments, the EMI enclosure 200 is manufactured from a copper or aluminum material that is highly thermally conductive rather than steel material, which has lower thermal conductivity. The EMI enclosure 200 may be manufactured from other highly thermally conductive materials in alternative embodiments. The EMI enclosure 200 may be plated, such as with a nickel plating. In other various embodiments, the EMI enclosure 200 may be coated, such as being powder coated. The coating may have high emissivity to boost infrared radiation. In various embodiments, the EMI enclosure 200 may be formed as a drawn part. In other various embodiments, the EMI enclosure 200 may be a stamped and formed part.

In an exemplary embodiment, the EMI enclosure 200 is generally box shaped. The EMI enclosure 200 includes a first end wall 210 and a second end wall 212 opposite the first end wall 210. The EMI enclosure 200 includes a first side wall 214 and a second side wall 216 opposite the first side wall 214. The first and second side walls 214, 216 extend between the first and second end walls 210, 212. The EMI enclosure 200 includes a back wall 218 at a rear of the EMI enclosure 200. In various embodiments, the EMI enclosure 200 may be oriented such that the first end wall 210 defines a top wall of the EMI enclosure 200 and the second end wall 212 defines a bottom wall of the EMI enclosure 200. However, other orientations are possible in alternative embodiments.

In an exemplary embodiment, the EMI enclosure 200 includes a front opening 220 at the front of the EMI enclosure 200. The front opening 220 provides access to the chamber 204. For example, the housing 110 and the electrical components 104 are loaded into the chamber 204 through the front opening 220. The EMI enclosure 200 may include greater or fewer walls in alternative embodiments, which may change the shape of the EMI enclosure 200. In an exemplary embodiment, the EMI enclosure 200 includes an enclosure mounting flange 222 at the front of the EMI enclosure 200. The mounting flange 222 surrounds the front opening 220. The mounting flange 222 is configured to be mounted to the equipment.

In an exemplary embodiment, the EMI enclosure 200 includes rear openings 224 in the back wall 218. The rear openings 224 may receive portions of the housing 110 and/or the electrical components 104. For example, the power terminals 122 may extend through the rear openings 224 for electrical connection with another component, such as an electrical connector or a power cable of the equipment. In the illustrated embodiment, the rear openings 224 are located near the second end wall 212.

In an exemplary embodiment, the EMI enclosure 200 includes retention features 226 extending into the chamber 204. The retention features 226 are used to retain the housing 110 in the chamber 204. In the illustrated embodiment, the retention features 226 are deflectable barbs or latches extending into the chamber 204. Other types of retention features may be used in alternative embodiments. In an exemplary embodiment, the retention features 226 are stamped from corresponding walls 202 of the EMI enclosure 200. For example, the retention features 226 may be stamped from the first and second side walls 214, 216. The retention features 226 may be located proximate to the front of the EMI enclosure 200. However, other locations are possible in alternative embodiments.

The EMI enclosure 200 includes one or more flaps 230 extending from corresponding walls 202 into the chamber 204. In an exemplary embodiment, the flaps 230 are stamped out of the walls 202 and bent inward into the chamber 204. For example, the flaps 230 may be formed during a stamping and forming process. The flaps 230 are integral with the walls 202 and made from the walls 202. In an exemplary embodiment, during the stamping process, a slot 232 is cut into the walls 202 to form the flap 230 in a predetermined shape, leaving a wall portion 234 along and/or around the flap 230. In various embodiments, the flap 230 may have a trapezoidal shape. The trapezoidal shape may improve the force and deflection profile of the flap 230 to mate intimately with the electrical component 104 or the thermal pad 146 on the electrical insulator 140. The flap 230 is bent inward into the chamber 204 to extend closer to the heat generating electrical components 104 within the chamber 204. As such, the flaps 230 are used to efficiently transfer heat away from the heat generating electrical components 104. The walls 202 of the EMI enclosure 200 define a heatsink to dissipate the heat from the electrical components 104. The walls 202 of the EMI enclosure 200 may be air cooled by airflow around the EMI enclosure 200. Additional flaps may be provided, such as from another heat sinking device connected to the EMI enclosure 200.

In an exemplary embodiment, each of the side walls 214, 216 include corresponding flaps 230, which may be referred to as side flaps 236. The side flaps 236 extend inward from the side walls 214, 216 along both sides of the chamber 204 to interface with corresponding electrical component 104. In an exemplary embodiment, the side flaps 236 are configured to thermally interface with the fuse contacts 132 (shown in FIG. 3) at the opposite sides of the housing 110. The side flaps 236 dissipate heat from the fuse contacts 132 to dissipate heat from the fuses 130. The side flaps 236 may thermally interface with other electrical components 104 in alternative embodiments. Each side wall 214, 216 may include a single side flap 236 or multiple sides flaps 236.

In the illustrated embodiment, the side walls 214, 216 include nested or embedded side flaps 237 that are embedded within the side flaps 236. For example, the embedded side flaps 237 are stamped from the side flaps 236. The embedded side flaps 236 move independently relative to the side flaps 236. The embedded side flaps 236 may thermally interface with different electrical components 104 or a different area of the electrical component 104 compared to the side flaps 236. For example, the side flaps 236 may thermally interface with corresponding fuse contacts 132 (for example, input fuse contacts 132*a*) and the embedded side flaps 237 may thermally interface with different fuse contacts 132 (for example, output fuse contacts 132*b*).

In an exemplary embodiment, the second end wall 212 includes one or more of the flaps 230, which may be referred to as end flaps 238. The second side wall 216 may include a single end flap 238 or multiple end flaps 238. The end flaps 238 may thermally interface with the power terminals 122 (shown in FIG. 4) or other electrical components 104 to dissipate heat from the power terminals 122 or other electrical components 104. Other walls, such as the first end wall 210 and/or the back wall 218 may include one or more of the flaps 230 in alternative embodiments.

In an exemplary embodiment, each flap 230 includes a hinge 240 at a proximal end 242 of the flap 230 and a tip 244 at a distal end 246 of the flap 230. In an exemplary embodiment, the flap 230 is trapezoidal shaped having side edges 248 between the proximal end 242 and the distal end 246. The side edges 248 are angled non-parallel to each other. In various embodiments, the distal end 246 is centered relative to the proximal end 242 along a central axis of the flap 230, which extends perpendicular to the hinge 240. However, in alternative embodiments, the distal end 246 may be offset relative to the central axis. The proximal end 242 may be oriented generally parallel to the distal end 246. In various embodiments, the proximal end 242 is longer than the distal end 246. However, in alternative embodiments, the distal end 246 may be longer than the proximal end 242. The flap 230 is hingedly coupled to the wall portion 234 at the hinge 240. The flap 230 may be folded inward into the chamber 204 at the hinge 240. The flap 230 is pressed inward into the chamber 204 to position the distal end 246 within the chamber 204 to interface with the housing 110 and/or the electrical component 104 when the housing 110 and the electrical components 104 are loaded into the chamber 204. The flap 230 may be deflected or deformed when engaging the electrical component 104 or the thermal pad 146 to maintain contact with such part for improved thermal transfer therebetween.

The flap 230 includes a flap thermal interface 250 located proximate to the tip 244. The flap thermal interface 250 is configured to be thermally coupled to the heat generating electrical component 104. The flap thermal interface 250 may have a large surface area to efficiently transfer heat between the heat generating electrical component 104 and the flap 230.

In an exemplary embodiment, the hinge 240 of the embedded side flap 237 is coincident with the hinge 240 of the side flap 236. However, in alternative embodiments, the hinge 240 of the embedded side flap 237 may be remote from the hinge 240 of the side flap 236, such as within the flap 230 or starting outside of the flap 237 in the wall portion 234. In various embodiments, the central axis of the embedded side flap 237 is coincident with the central axis of the side flap 236. For example, the flap thermal interfaces 250 of the embedded side flap 237 and the side flap 236 may be aligned with each other along the central axes of the flaps 230. However, the embedded side flap 237 may be offset relative to the side flap 236 in alternative embodiments.

The side flap 236 is separated from the wall portion 234 by the slot 232. The slot 232 extends along three sides of the side flap 236. The fourth side of the side flap 236 defines the hinge 240 that connects the side flap 236 to the wall portion 234. The slot 232 thermally separates or isolates the side flap 236 from the wall portion 234. Heat is transferred along the side flap 236 from the flap thermal interface 250 along the main body of the side flap 236 and across the hinge 240 into the back wall portion 218.

The embedded side flap 237 is separated from the side flap 236 by the slot 233. The slot 233 extends along three sides of the embedded side flap 237. The fourth side of the embedded side flap 237 defines the hinge 240 that connects the embedded side flap 237 to the side flap 236 or the wall portion 234, so that the embedded side flap 237 moves relatively independently of side flap 236. The embedded side flap 237 may be independently deflected or deformed against the electrical component 104 or the thermal pad 146. The nested slot 233 thermally separates the embedded side flap 237 from the side flap 236. Heat is transferred along the embedded side flap 237 from the embedded flap thermal interface 251 along the main body of the embedded side flap 237 and across the hinge 240 into the side flap 236 and/or the wall portion 234.

The size (for example surface area) of the flap thermal interface 250, and the insulator thermal pads 146 affect the thermal transfer rate from the heat generating electrical component 104 to the heat sink defined by the walls 202 of the EMI enclosure 200. For example, the larger the size of the flap thermal interface 250 and/or the insulator thermal pads 146, the greater the thermal transfer load to the flap 230, and the greater the dissipation of heat from flap 230. A larger flap 230 is able to more quickly dissipate heat from the heat generating electrical component 104. Similarly, the greater the cross section of flap 230, the greater the thermal transfer rate from the flap thermal interface to the proximal end of the flap 242. In contrast, the slot 232 creates a thermal break between the flap 230 and the wall portion 234. The air within the slot 232, and the adjacent electrical insulator 140 material that may separate it from the internal components 104 create the thermal break. The shape of the slot 232 dictates the placement of the thermal breaks between the flap 230 and the wall portion 234. The slot 232 may be used to create cooler areas within the EMI enclosure 200. The cooler areas may be designed to be located next to heat sensitive components within the chamber 204 of the EMI enclosure 200. As such, the EMI enclosure 200 may have areas of different thermal gradient, such as hot areas and cool areas, relative to each other. The positioning of the flaps 230 and the slots 232 may control the locations of the hot areas and the cooler areas. For example, the flaps 236 and 237 may be the hot areas cooled by dissipation and conduction to the back wall 218 adjacent the hinges 240, while the end flaps 238 may be the cool areas cooled by their dissipation and conduction to the wall portion 234 across the slots 232 and remote from the hinges 240.

In an exemplary embodiment, the side flap 236 is surrounded by the corresponding slot 232 and the end flap 238 is surrounded by the corresponding slot 232. The end flap 238 is separated from the side flap 236 by both slots 232 and the wall portions 234 of the side wall 202 and the end wall 202. The wall portions 234 dissipate heat. The flaps 236, 238 transfer the heat from the heat generating components into the wall portions 234 of the walls 202. In an exemplary embodiment, the side flap 236 has the corresponding proximal end 242 and the distal end 246 and the end flap 238 has the corresponding proximal end 242 and the distal end 246. The distal end 246 of the side flap 236 is located closer to the front of the EMI enclosure 200. The proximal end 248 of the side flap 236 is located closer to the rear and the back wall 218. The heat from the side flap 236 is transferred into the rear portion of the side walls 214, 216 and the back wall 218. The distal end 246 of the end flap 238 is located closer to the rear of the EMI enclosure 200. The proximal end 248 of the end flap 238 is located closer to the front. The heat from the end flap 236 is transferred into the front portion of the end wall 212. Heat is dissipated through the walls 202 of the EMI enclosure, such as through the elongated or tortuous path defined by the wall portions 234 between the proximal ends 248 (for example, fixed ends) of the flaps 236, 238. The long paths provide sufficient surface area for heat dissipation, such as to reduce or avoid heating up of one of the flaps 236 or 238 by the other flap 236 or 238. In an exemplary embodiment, the proximal end 248 of the side flap 236 is separated from the proximal end 248 of the end flap 238 by a separation distance greater than a first length (defined between the proximal end 248 and the distal end 246) of the side flap 236 and greater than a second length (defined between the proximal end 248 and the distal end 246) of the end flap 238.

Figure 8:
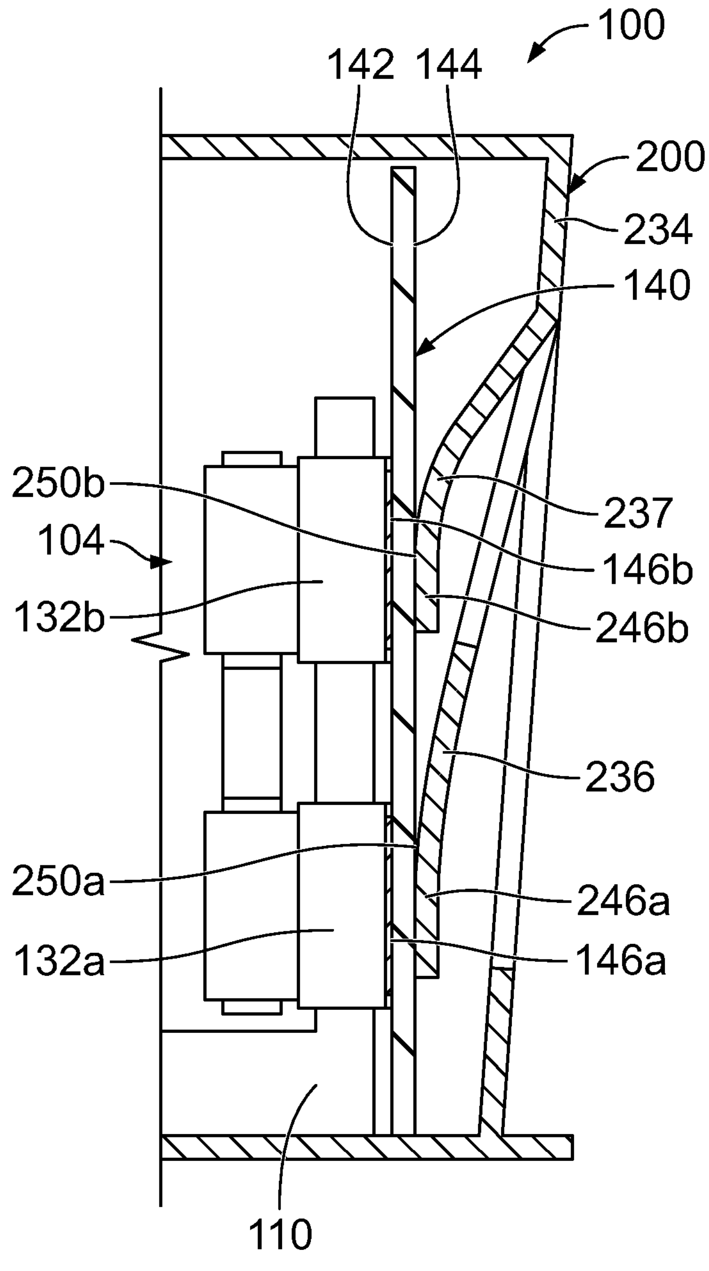
FIG. 8 is a cross-sectional view of a portion of the power connector in accordance with an exemplary embodiment.

FIG. 8 is a cross-sectional view of a portion of the power connector 100 in accordance with an exemplary embodiment. FIG. 8 shows the EMI enclosure 200 surrounding the housing 110 and the heat generating electrical components 104. The EMI enclosure 200 provides electrical shielding for the electrical components 104. The EMI enclosure 200 is used for dissipating heat from the heat generating electrical components 104.

In the illustrated embodiment, one of the side flaps 236 and one of the embedded side flaps 237 are illustrated thermally coupled to the corresponding electrical components 104. In the illustrated embodiment, the side flap 236 and the embedded side flap 237 are thermally coupled to the input fuse contact **132*a* and the output fuse contact 132*b*, respectively. The flap thermal interfaces 250*a*, 250*b* are thermally coupled to the input fuse contact 132*a* and the output fuse contact 132*b*, respectively. The flaps 236, 237** are spring biased toward the fuse contacts 132*a*, 132*b* to ensure efficient thermal transfer between the flaps 236, 237 and the fuse contacts 132*a*, 132*b*. The distal ends 246*a*, 246*b* is located closer to the electrical components 104 than the wall portions 234 to improve thermal transfer (for example, based on proximity) with the electrical components 104.

The electrical insulator 140 is disposed between the flaps 236, 237 and the fuse contacts 132*a*, 132*b*. The electrical insulator 140 electrically isolates the flaps 236, 237 from the fuse contacts 132*a*, 132*b*. In an exemplary embodiment, the thermal pads 146*a*, 146*b* are provided along the filler material of the electrical insulator 140 to enhance thermal transfer between the flaps 236, 237 and the fuse contacts 132*a*, 132*b*. In the illustrated embodiment, the thermal pads 146*a*, 146*b* are provided along the inner surface 144. The fuse contacts 132*a*, 132*b* directly engage the thermal pads 146*a*, 146*b*. The thermal pads 146*a*, 146*b* may be copper layers applied directly to the outer surface 144. The thermal pads 146*a*, 146*b* have large surface areas to provide efficient thermal transfer with the flaps 236, 237 and/or the fuse contacts 132*a*, 132*b*. In alternative embodiments, the thermal pads 146*a*, 146*b* may be provided along the outer surface 144. In other alternative embodiments, the thermal pads 146*a*, 146*b* may be provided along both the inner surface 142 and the outer surface 144 with the electrically insulating film therebetween.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A power connector comprising:

a housing extending between a front and a rear and having a front wall at the front including a socket configured to receive a power plug;

power contacts held by the housing, the power contacts having mating ends in the socket for mating with the power plug;

an electrical component held by the housing, the electrical component being electrically connected to at least one of the power contacts, the electrical component being a heat generating component;

an electromagnetic interference (EMI) enclosure coupled to the housing, the EMI enclosure having walls surrounding and defining a chamber, the housing being received in the chamber with the walls extending between the front and the rear of the housing, the power contacts received in the chamber and surrounded by the walls, the electrical component received in the chamber and surrounded by the walls, the walls of the EMI enclosure providing EMI shielding for the electrical component above, below and along opposite sides of the chamber an entire depth of the housing between the front and the rear of the housing, the EMI enclosure including a first flap extending from a first wall of the walls into the chamber, the first flap being deflectable relative to the first wall, the first flap including a flap thermal interface thermally coupled to the electrical component to dissipate heat from the electrical component; and an electrical insulator between the first flap and the electrical component, the electrical insulator being thermally conductive, the electrical insulator including a flexible film having a thermal pad on the flexible film, the thermal pad being thermally conductive, the thermal pad being positioned between the first flap and the electrical component.

2. The power connector of claim 1, wherein the first flap is stamped from the first wall.

3. The power connector of claim 1, wherein a slot is defined in the first wall between the first flap and a first wall portion of the first wall, the slot thermally separates the first flap from the first wall portion.

4. The power connector of claim 1, wherein the first wall is a first side wall, the walls include a second side wall opposite the first side wall, a first end wall extending between the first and second side walls, and a second end wall extending between the first and second side walls, the walls including a back wall at a rear of the chamber to provide shielding along the rear of the housing, the first side wall, the second side wall, the first end wall, and the second end wall extending to the front of the housing.

5. The power connector of claim 1, wherein the EMI enclosure includes a second flap extending from a second wall of the walls into the chamber, the second flap including a second flap thermal interface.

6. The power connector of claim 5, wherein the second wall is parallel to the first wall and on an opposite side of the chamber from the first wall.

7. The power connector of claim 5, wherein the second wall extends from the first wall and is oriented perpendicular to the first wall.

8. The power connector of claim 5, wherein the second flap is thermally coupled to a second electrical component located in the chamber.

9. The power connector of claim 1, wherein the first wall includes a second flap extending into the chamber, the second flap being independently deflectable from the first flap.

10. The power connector of claim 9, wherein the second flap is embedded in the first flap.

11. The power connector of claim 1, wherein the electrical component is a fuse contact electrically connected to a fuse held in the housing, the flap thermal interface of the first flap being thermally coupled to the fuse contact to dissipate heat from the fuse contact.

12. The power connector of claim 1, wherein the first flap includes a hinge at a proximal end of the first flap and a tip at a distal end of the first flap, the flap thermal interface located proximate to the tip, the first flap being trapezoidal shaped having side edges between the proximal end and the distal end, the side edges being angled non-parallel to each other, the proximal end being longer than the distal end.

13. The power connector of claim 1, wherein the first wall includes a wall portion separated from the first flap by a slot, the slot thermally separating the first flap from the wall portion, the wall portion having a cooler temperature than the first flap when the first flap is dissipating heat from the electrical component.

14. The power connector of claim 1, wherein the EMI enclosure includes a second flap embedded in the first flap, the second flap being separated from the first flap by a slot, the slot thermally separating the first flap from the second flap.

15. The power connector of claim 14, wherein the second flap includes a second flap thermal interface aligned with the flap thermal interface along an axis.

16. The power connector of claim 1, wherein the first flap is surrounded by a first slot, the EMI enclosure including a second flap surrounded by a second slot, the second flap being separated from the first flap by the first slot, at least one wall portion, and the second slot.

17. The power connector of claim 1, wherein the enclosure extends between a front and a rear, the first flap having a first proximal end and a first distal end, the first distal end being closer to the rear, the EMI enclosure including a second flap having a second proximal end and a second distal end, the second distal end being closer to the front.

18. The power connector of claim 17, wherein the first proximal end is separated from the second proximal end by a separation distance greater than a first length of the first flap between the first proximal end and the first distal end and greater than a second length of the second flap between the second proximal end and the second distal end.

19. The power connector of claim 1, further comprising:

a power terminal held by the housing, the power terminal having a terminating end configured to be electrically connected to a device power circuit of a device to supply power to the device;

a fuse holder coupled to the housing, the fuse holder including a fuse pocket holding a fuse, the fuse having end caps and a fuse wire between the end caps;

an input fuse contact coupled to the power contact, the input fuse contact including an input contact arm coupled to the corresponding end cap of the fuse; and an output fuse contact coupled to the power terminal, the output fuse contact including an output contact arm coupled to the corresponding end cap of the fuse;

wherein at least one of the power terminal, the input fuse contact and the outer fuse contact defining the electrical component; and wherein the chamber of the EMI enclosure receives the fuse, the input fuse contact, and the output fuse contact, the walls of the EMI enclosure providing EMI shielding for the fuse, the flap thermal interface of the first flap being thermally coupled to at least one of the input fuse contact and the output fuse contact.

20. A power connector comprising:

a housing having a front wall including a socket configured to receive a power plug;

power contacts held by the housing, the power contacts having mating ends in the socket for mating with the power plug;

an electrical component held by the housing, the electrical component being electrically connected to at least one of the power contacts, the electrical component being a heat generating component;

an electromagnetic interference (EMI) enclosure coupled to the housing, the EMI enclosure having walls defining a chamber, the housing being received in the chamber, the power contacts received in the chamber, the electrical component received in the chamber, the walls of the EMI enclosure providing EMI shielding for the electrical component, the EMI enclosure including a first flap extending from a first wall of the walls into the chamber, the first flap being deflectable relative to the first wall, the first flap including a flap thermal interface thermally coupled to the electrical component to dissipate heat from the electrical component, the EMI enclosure including a second flap embedded in the first flap.

21. The power connector of claim 20 wherein the second flap is separated from the first flap by a slot, the slot thermally separating the first flap from the second flap.

22. The power connector of claim 20, further comprising an electrical insulator between the first flap and the electrical component, the electrical insulator being thermally conductive.

23. The power connector of claim 22, wherein the electrical insulator includes a flexible film having a thermal pad on the flexible film, the thermal pad being thermally conductive, the thermal pad being positioned between the first flap and the electrical component.

* * * * *